United States Patent
Young et al.

(10) Patent No.: US 10,707,898 B2
(45) Date of Patent: Jul. 7, 2020

(54) TRACING ENGINE-BASED SOFTWARE LOOP ESCAPE ANALYSIS AND MIXED DIFFERENTIATION EVALUATION

(71) Applicant: Fidelity Information Services, LLC, Jacksonville, FL (US)

(72) Inventors: Benjamin Christopher Young, Ely (GB); Chaoming Chan, Toronto (CA)

(73) Assignee: Fidelity Information Services, LLC, Jacksonville, FL (US)

( * ) Notice: Subject to any disclaimer, the term of this patent is extended or adjusted under 35 U.S.C. 154(b) by 277 days.

(21) Appl. No.: 15/658,975

(22) Filed: Jul. 25, 2017

(65) Prior Publication Data
US 2019/0036544 A1    Jan. 31, 2019

(51) Int. Cl.
*H03M 7/30*     (2006.01)
*G06F 8/41*     (2018.01)
(Continued)

(52) U.S. Cl.
CPC ............. *H03M 7/60* (2013.01); *G06F 8/41* (2013.01); *G06F 8/4434* (2013.01);
(Continued)

(58) Field of Classification Search
CPC ....... H03M 7/60; H03M 7/6011; G06F 16/22; G06F 8/41; G06F 8/4434; G06F 11/34;
(Continued)

(56) References Cited

U.S. PATENT DOCUMENTS 4,817,027 A  *  3/1989  Plum ...................... G06F 17/13
                                                                            708/443
5,692,233 A  *  11/1997  Garman ................. G06Q 40/00
                                                                            705/35

(Continued)

OTHER PUBLICATIONS

Bartholomew-Biggs, Michael, Steven Brown, Bruce Christianson, and Laurence Dixon. "Automatic differentiation of algorithms."; Journal of Computational and Applied Mathematics;124, No. 1-2 (2000): 171-190. (Year: 2000).*

(Continued)

*Primary Examiner* — Jesse P Frumkin
(74) *Attorney, Agent, or Firm* — Finnegan, Henderson, Farabow, Garrett & Dunner LLP

(57) ABSTRACT

Systems and methods are provided for loop escape analysis in executing computer instructions. In one embodiment, a method comprises instructions performed by at least one computer process. The method comprises receiving a set of executable computer instructions stored on a storage medium (e.g., by reading the instructions from a tangible, non-transitory storage medium). The method further comprises analyzing the computer instructions to determine a loop, analyzing the computer instructions to determine at least one new variable in the loop, and storing, in a data structure, at least one of an operation related to the variable or a value related to the variable. The method further comprises determining whether to compress the data structure upon reaching the end of the loop, and, based on the determination, compressing the data structure. Systems and computer-readable media are also provided.

15 Claims, 7 Drawing Sheets

(51) Int. Cl.
   *G06F 16/22*   (2019.01)
   *G06F 17/10*   (2006.01)
   *G06F 11/36*   (2006.01)
   *G06F 11/34*   (2006.01)
   *G06F 11/30*   (2006.01)

(52) U.S. Cl.
   CPC ............ *G06F 11/302* (2013.01); *G06F 11/34* (2013.01); *G06F 11/3466* (2013.01); *G06F 11/3636* (2013.01); *G06F 16/22* (2019.01); *G06F 17/10* (2013.01); *G06F 2201/865* (2013.01); *H03M 7/6011* (2013.01)

(58) Field of Classification Search
   CPC ............... G06F 11/302; G06F 11/3466; G06F 11/3636; G06F 2201/865
   See application file for complete search history.

(56) References Cited

U.S. PATENT DOCUMENTS

| | | | | |
|---|---|---|---|---|
| 7,236,952 | B1* | 6/2007 | D'Zmura | G06Q 40/04 705/36 R |
| 8,131,612 | B1* | 3/2012 | Payne | G06Q 40/00 705/35 |
| 8,706,601 | B1* | 4/2014 | Payne | G06Q 40/06 705/35 |
| 9,058,449 | B2* | 6/2015 | Capriotti | G06F 17/5018 |
| 10,268,459 | B1* | 4/2019 | Christian | G06F 8/35 |
| 2003/0023645 | A1* | 1/2003 | Walster | G06F 17/10 708/6 |
| 2004/0260708 | A1* | 12/2004 | Hosoi | G06F 8/4434 |
| 2006/0075011 | A1* | 4/2006 | Fallah | G06F 17/10 708/490 |
| 2007/0294156 | A1* | 12/2007 | Hughes | G06Q 40/06 705/36 R |
| 2008/0114785 | A1* | 5/2008 | Bernstein | G06F 16/258 |
| 2008/0189345 | A1* | 8/2008 | Guenter | G06F 17/10 708/443 |
| 2009/0012754 | A1* | 1/2009 | Mosterman | G06F 8/34 703/2 |
| 2009/0077543 | A1* | 3/2009 | Siskind | G06F 8/447 717/136 |
| 2009/0265685 | A1* | 10/2009 | Guenter | G06F 17/10 717/106 |
| 2012/0123746 | A1* | 5/2012 | Postma | G06F 17/13 703/2 |
| 2012/0150504 | A1* | 6/2012 | Akrotirianakis | G06F 17/11 703/2 |
| 2012/0179437 | A1* | 7/2012 | Shmoylova | G06F 17/13 703/2 |
| 2013/0132031 | A1* | 5/2013 | Gilg | G06F 17/13 702/181 |
| 2018/0267783 | A1* | 9/2018 | Kawaguchi | G06F 8/433 |

OTHER PUBLICATIONS

"FindSequenceFunction" Web page <https://reference.wolfram.com/language/ref/FindSequenceFunction.html>, Mar. 16, 2016, retrieved from Internet Archive Wayback Machine <https://web.archive.org/web/20160316195322/https://reference.wolfram.com/language/ref/FindSequenceFunction.html> on Nov 8, 2019 (Year: 2016).*

"Sums, products, limits, and extrapolation" Web page https://docs.sympy.org/0.7.6/modules/mpmath/calculus/sums_limits.html, May 27, 2016, from Internet Archive Wayback Machine https://web.archive.org/web/20160527053528/https://docs.sympy.org/0.7.6/modules/mpmath/calculus/sums_limits.html (Year: 2016).*

* cited by examiner

TRACING ENGINE-BASED SOFTWARE LOOP ESCAPE ANALYSIS AND MIXED DIFFERENTIATION EVALUATION

FIELD

Embodiments of this disclosure relate to improved techniques for algorithmic differentiation for sensitivity modeling. In particular, embodiments of the present disclosure enable improved memory compression in algorithmic differentiation techniques using emulation techniques and the use of an improved processing engine which intelligently selects a mode of operation.

BACKGROUND

Systems and methods for sensitivities calculation relate to how the output of a calculation depends upon small changes to inputs to the calculation. These calculations, which make up part of complex computer software, can be of paramount importance to many business problems—including manufacturing, simulation, construction, and other math-heavy processes. Complicating this fact is that sensitivities calculation of heavy simulation-based measurements can be one of the most computationally intensive calculations a computer can perform.

For example, take a hypothetical process for calculating the yield of a chemical process involving three inputs and a single output. A manufacturer may desire to calculate up to tens of thousands of sensitivities to determine the effect that each level of change in the makeup of inputs has on the output.

Other processes take advantage of sensitivities calculation as well. For example, financial calculations may involve thousands or millions of inputs, such as interest rates, cash flow values, and the like. Financial institutions may wish to understand risk by determining how individual inputs to financial models affect the value of investments.

One approach to calculate sensitivities is via "bump-and-run" schemes, where one input (of many) is changed, an output is determined, the input is changed again slightly, a new output is determined, and so on, until all possible input variations have been used. The more sensitivities are required, the less efficient bump-and-run is, and calculating sensitivities for many thousand or millions of inputs may be difficult and/or impractical.

Another approach is known as forward-calculating "finite difference." In this type of calculation, numerical derivatives are calculated at each stage of the calculation with numerous inputs. This, too, can require numerous calculations and high memory usage.

It is clear that advanced sensitivities calculation methods that can increase both accuracy and calculation speed are attractive. Moreover, it is not always efficient to use forward sensitivity tracing, for example, when the amount of input data exceeds the amount of output. Other types of sensitivity calculations exist, but as of yet no one has developed a system for dynamically selecting which method to use.

It is accordingly an object of the disclosed embodiments to solve these problems as well as others as will be apparent to those of skill in the art.

SUMMARY

Embodiments of the present disclosure are directed to methods, systems, and computer-readable media for loop escape analysis in executing computer instructions. In one embodiment, a method comprises instructions performed by at least one computer process. The method comprises receiving a set of executable computer instructions stored on a storage medium (e.g., by reading the instructions from a tangible, non-transitory storage medium). The method further comprises analyzing the computer instructions to determine a loop, analyzing the computer instructions to determine at least one new variable in the loop, and storing, in a data structure, at least one of an operation related to the variable or a value related to the variable. The method further comprises determining whether to compress the data structure upon reaching the end of the loop, and, based on the determination, compressing the data structure.

Systems and computer-readable media (such as non-transitory computer-readable media) that implement the above method are also provided.

Additional objects and advantages of the embodiments will be set forth in part in the description which follows, and in part will be obvious from the description, or may be learned by practice. The objects and advantages will be realized and attained by means of the elements and combinations particularly pointed out in the appended claims.

It is to be understood that both the foregoing general description and the following detailed description are exemplary and explanatory only and are not restrictive of the claims.

BRIEF DESCRIPTION OF THE DRAWINGS

The accompanying drawings, which are incorporated in and constitute a part of this specification, illustrate several embodiments and together with the description, serve to explain some principles.

DETAILED DESCRIPTION

Figure 1:
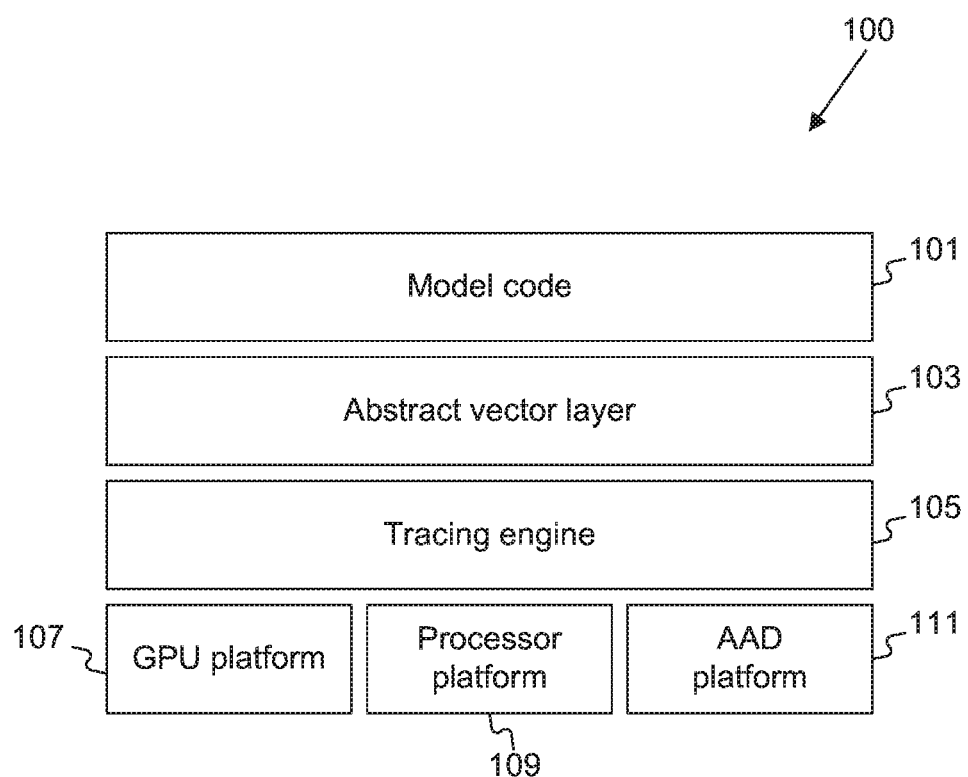
FIG. 1 depicts an exemplary platform for implementing the disclosed embodiments.

Example embodiments of this disclosure are related to improved methods and systems for sensitivities calculation. Sensitivities calculations relate to how the output of a calculation depends upon changes to inputs to the calculation. These calculations can be used in manufacturing, computer, mathematical, and business problems. Sensitivities calculation of heavy simulation-based measurements can be one of the most computationally intensive calculations a computer can perform, especially when there are many inputs to a single formula or process.

For example, imagine a chemical engineering process for calculating the yield of a chemical process, modeled in a computer program, and requiring three inputs: a volume of a chemical, a stir time, and a cure time. The process may involve, for example, stirring the chemical for the stir time (e.g., 10 seconds) and allowing it to cure for the cure time (e.g., one second). A manufacturer may desire to calculate up to tens of thousands of possibilities to determine the ideal mixture of these inputs. Continually performing such processes with minor differences—such as ten extra seconds of cure time, 100 extra milliliters of the chemical, or one-half extra second of stir time—can require a lot of extra time and wasted materials. Instead of performing the process multiple times, the disclosed embodiments enable the determination of the sensitivities of each stage of the process—the addition of the chemical, the stirring of the chemical, and the curing of the chemical—to determine the sensitivities of the output of the process based on the inputs.

Other processes take advantage of sensitivities calculations as well. For example, Credit Valuation Adjustments (CVA) represent a difference between a value of a portfolio (e.g., a set of transactions upon which it is assumed that the parties will not default) and the true value of that portfolio, taking into account the possibility of another party defaulting on the transactions. A full CVA calculation has a single output, and possibly tens of thousands of different inputs (e.g., interest rates, exchange rates, etc). A full understanding of the market risk of CVA requires computing sensitivities to these tens of thousands of inputs. Further, as CVA computation itself is a complex simulation, computing this large number of sensitivities via the "bump-and-run" method is cumbersome. By tracing backwards to determine the sensitivities, one can determine the sensitivities for each stage of the CVA calculation, which enables the manager of that portfolio to understand how each input (e.g., interest rate, time frame, swap) modifies the end result.

One concept enabling embodiments of the present disclosure is the "chain rule." The chain rule is a manner of calculating the derivative (e.g., a sensitivity) of the composition of two or more functions. For example, imagine variables x, y, and z, such that the value of z depends upon the value of y, and the value of y depends upon the value of x. From this relationship, it is clear that the value of z depends upon x as well. This may be written in Leibnitz's notation as a product of partial derivatives, or:

$$\frac{\partial z}{\partial x} = \frac{\partial z}{\partial y} * \frac{\partial y}{\partial x}$$

FIG. 1 depicts an exemplary platform 100 for implementing the disclosed embodiments. Platform 100 may represent, for example, a software program that performs large-scale calculations such as solving nonlinear equations, optimization problems, neural network calculations, physics calculations, physical modeling (for complex items such as aerodynamic items), financial calculations, radiation therapy calculation, or inverse problems, to name a few. Each block in platform 101 may be implemented on one or more processors (e.g., CPU 502 in FIG. 5).

In some embodiments, portions of platform 100 may represent a software program that has been modified to operate with additional layers in order to enable the disclosed embodiments. For example, model code 101 represents a "base" or original software program. A programmer may write model code 101 in order to perform calculations such as those discussed above. Model code 101 may be written in a high level language (e.g., C++, C #, Java) or any other type of programming language. Model code 101 may also be written using an API (Application Programming Interface) or other language that enables compiled code to be executed using one or more Graphics Processing Units (GPUs).

Abstract vector layer 103 represents software code that operates in tandem with model code 101. For example, abstract vector layer 103 may comprise software code that enables faster processing of particular mathematical operations using data structures that extend data structures used in the programming language of model code 101. One example of layer 103 comprises one or more data structures or data types that are used to override (or "overload") data structures used in model code 101.

For example, the programming language used to create model code 101 may comprise an integer data type, and part of model code 101 may comprise an instruction to add a high number of said integers. While in model code 101, adding a high number of integers together may comprise a large number of operations, thus contributing to high overhead and processing power, abstract vector layer 103 may extend the integer data type used in model code 101 to enable a single operation to take the place of a large number of operations.

Model code 101 and abstract vector layer 103 may operate together using operator overloading or other known types of polymorphic techniques. In some embodiments, model code 101 may be recompiled (e.g., by a computer processor (not shown)) using abstract vector layer 103 (e.g., as a code library).

Tracing engine 105 represents software code that is used to analyze model code 101 and perform optimizations of model code 101. For example, tracing engine 105 may locate and keep track of "loops" in model code 101, trace operations performed in model code 101, and to monitor objects (e.g., variables, data, or the like) during execution of model code 101. For example, model code 101 may include one or more loops that repetitively perform a set of steps. A loop, in some embodiments, is a control flow structure that specifies a series of instructions that may be carried out multiple times. Whether or not a processor performs instructions in a loop may be based on a condition (e.g., perform instructions 10 times, until the sum of two numbers is greater than 5, or until the program is ended).

The following simple example written in the C programming language uses nested "for" loops to print to the user whether each number between 2 and 200 is prime or composite, and prints the square of each non-prime found:

```
int i, j;
for(i=2; i<200; i++) {
    for(j=2; j<=(i/j); j++) {
        if( (i % j)==0 ) {
            printf("%d is NOT prime, and ", i);
            int square_i = pow(i,2);
            printf("%d squared is %d\n", i, square_i);
            break;
        }
    }
    if(j > (i/j)) {
        printf("%d IS prime\n", i);
    }
}
```

This simple program has two nested "for loops." The first loop (starting with "for (i=2; . . . )") takes as input (i.e., uses) the variable "i" while the second loop (starting with "for (j=2; . . . )") takes as input both "i" and "j." Tracing engine

105, in some embodiments, may keep track of the variables i and j and the values that are assigned to each one during execution of the program.

Tracing engine 105 may also, in some embodiments, keep track of which variables exist entirely within a loop. For example, the square_i variable is instantiated and used entirely within the second loop—it is not defined or used outside of that loop. As described below, tracing engine 105 may keep track of whether or not each variable exists entirely within a loop or not (also known as whether the variable "escapes" the loop).

Tracing engine 105 may be implemented in a variety of ways. Three examples of implementing tracing engine 105 follow, though one of ordinary skill will understand that variations and other ways of implementing tracing engine 105 are not excluded.

A first manner of implementing tracing engine 105 is by directly adding tracing code (e.g., instructions) to the model code 101. This manual implementation may require review of each dependency path (e.g., which variables are calculated based on which other variables) and the creation of parallel implementations for the derivatives of each variable to chain them together. This first manner may require tracing code that targets exactly the calculations required by model code 101. Each time model code 101 is modified, moreover, it may be required to modify the tracing code to account for the change in the program.

A second method of implementing tracing engine 105 is known as source code transformation, which is a variation of the first method. Instead of inserting tracing code into the source code itself, a source code transformation tool (e.g., another program) can be used to examine and modify the original source of model code 101 to include tracing capabilities. This second method may require re-running the tool each time model code 101 is changed to reinsert the tracing capabilities.

A third method of implementing tracing engine 105 is known as "operator overloading." This method may comprise utilizing the code structures of model code 101 and repurposing them to include separate data structures having tracing capabilities. For example, many modern computer languages support operator overloading, in which the steps performed by functions in a programming language maybe redefined to perform different or additional functions. This type of implementation may require less rewriting of code compared to the first or second implementations listed above.

These methods of implementing tracing engine 105 are not mutually exclusive and indeed other methods of implementing tracing engine 105 will be clear to one of skill in the art.

GPU platform 107 represents a Graphics Processing Unit (GPU) and/or associated functionality and hardware which may execute software (such as model code 101, abstract vector layer 103, and/or tracing engine 105). For example, GPU platform 107 may execute software code that is written using an API (Application Programming Interface) or language that enables compiled code to be executed by a GPU (e.g., Nvidia CUDA, Khronos OpenCL, Khronos Vulkan, Microsoft DirectCompute).

Processor platform 109 represents a specific type of computer processor and/or associated functionality and hardware which may execute software code (e.g., model code 101, abstract vector layer 103, and/or tracing engine 105). For example, processor platform 109 may be configured to execute software code designed for parallel processing of tasks, high-performance computing applications, or other computationally-intensive calculations. For example, processor platform 109 may execute software code that is configured to operate on specific processor platforms (e.g., Intel Xeon Phi, Nvidia Tesla, AMD Radeon Instinct) using programming languages designed to enable such intensive calculations (e.g., OpenMP).

AAD platform 111 represents a general-purpose CPU (Central Processing Unit) or other general-purpose processor and/or associated functionality and hardware which may execute software code (e.g., model code 101, abstract vector layer 103, and/or tracing engine 105). Processor platform 109 may execute software code that is compiled using a general-purpose programming language (e.g., C++).

GPU platform 107, processor platform 109, and AAD platform 111, in some embodiments, each represent different platforms for executing model code 101, abstract vector layer 103, and tracing engine 105. For example, depending on the particular type of calculation in model code 101, model code 101 may be configured to operate on one or more of GPU platform 107, processor platform 109, and AAD platform 111.

In some embodiments, abstract vector layer 103 may be implemented as described in U.S. Pat. No. 9,081,560, entitled "Code Tracing Processor Selection," which was filed on Sep. 30, 2013, and incorporated by reference herein in its entirety.

Figure 2A:
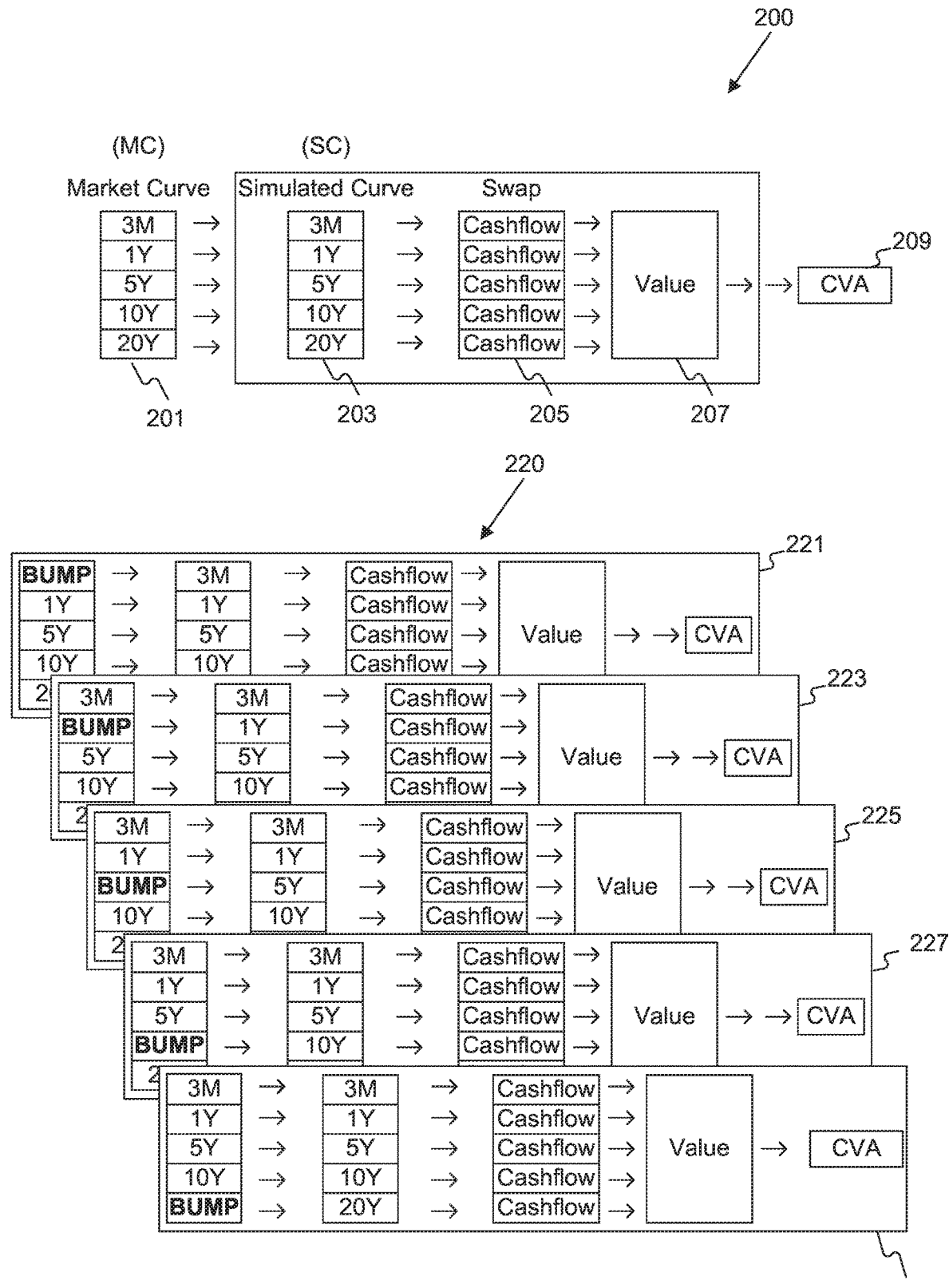
FIG. 2A depicts exemplary forward Tangent Automatic Differentiation (TAD) sensitivity calculations, consistent with disclosed embodiments.
Figure 2B:
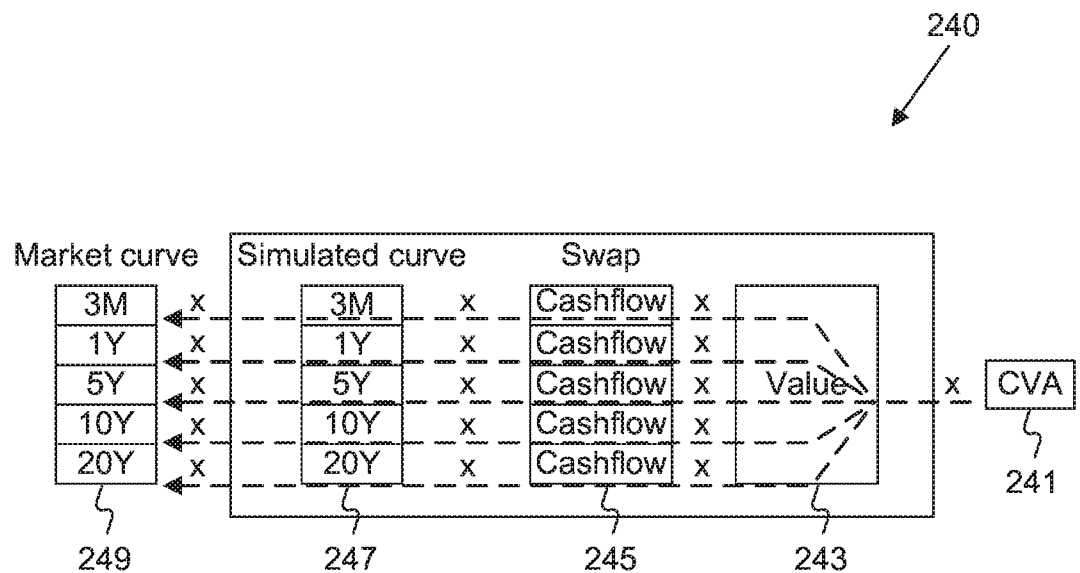
FIG. 2B depicts exemplary Adjoint Automatic Differentiation (AAD) sensitivity calculations, consistent with disclosed embodiments.

FIGS. 2A-2B represent example calculations for illustrating embodiments of the present disclosure. While FIGS. 2A and 2B represent calculations related to large-scale financial computations, one of skill will understand that numerous other types of calculations—such as physical science analysis (e.g., equilibrium calculations based on many inputs)—are possible as well. FIG. 2A may be understood as "forward" automatic differentiation while FIG. 2B may be understood as "backwards" automatic differentiation. The differentiation technique used to calculate sensitivities for a particular equation may depend in part upon the number of inputs and the number of outputs for that equation. For example, in situations such as those illustrated in FIGS. 2A and 2B, where there are many more inputs (e.g., market curve 201, simulated curve 203, swap 205, value 207) than outputs (e.g., CVA 209), using the methods described below with respect to FIG. 2A may be too intensive on memory and processor resources. A full CVA calculation may have thousands of variables and millions of inputs. Determining the sensitivities in the "forward" manner would be cumbersome if not impossible on a standard computer. Using the backwards automatic differentiation technique in FIG. 2B may prove to be quicker. Conversely, when given an equation with a small number of inputs and a large number of outputs, it may be more efficient to determine sensitivities in the "forward" manner depicted in FIG. 2A. Tracing engine 105, in some embodiments, may determine whether to use forward (FIG. 2A) or backward (FIG. 2B) tracing techniques based on a comparison of the number of inputs to a loop (e.g., how many variables are used in the loop) with the number of outputs from that loop (e.g., how many variables are instantiated before or inside of the loop and are utilized after processing the loop).

FIG. 2A depicts exemplary forward Tangent Automatic Differentiation (TAD) sensitivity calculations 200 and 220, consistent with disclosed embodiments.

Exemplary calculation 200 represents a Credit Valuation Adjustment (CVA) calculation. CVA calculations represent a difference between a value of a portfolio (e.g., a set of transactions) and the "true value" of that portfolio, taking into account another party defaulting on the transactions of that portfolio. CVA calculation 200, as depicted, represents a simplified set of dependency paths between points on a market curve 201 (e.g., riskless, stable future interest rates), points on a simulated curve 203 (e.g., simulated future interest rates), swap values 205 (e.g., a value representing a derivative contract in which two parties exchange cash flows associated with respective financial instruments), and value 207 (e.g., fair market value of a particular financial instrument such as a stock). For example, market curve 201 and simulated curve 203 may include respective interest rates for each of three months, one year, five years, ten years, and twenty years. Each "cash flow" value of swap 205 may contain different projected amounts as well. In this example, there are thus 125 (=5*5*5) different possible paths for calculating CVA 209.

The process of calculating CVA 209 may, in some embodiments, comprise simulating the value of a portfolio of the swaps represented by swap values 205. As valuation of these swaps may depend in part on interest rate curves, this in turn means we need to simulate the interest rate curves from today's curve (market curve 201) into future curves (simulated curve 203). With these future curves, we can compute forward values of the portfolio itself and the swaps, which yields CVA 209.

This example is simplified for ease of explanation. One of ordinary skill will understand that a CVA calculation may contain many more dependency paths. For example, a standard CVA calculation may comprise thousands or millions of dependency paths between a market curve (an input) and a calculated CVA (an output).

To calculate sensitivities for CVA calculation 200, one manner is known as "bump-and-run" calculation. Bump-and-run calculation involves making minor changes to a single input, keeping the rest of the inputs the same, then calculating the end result. For example, CVA calculation 221 may involve modifying the interest rate (e.g., increasing or decreasing by a small amount) associated with the market curve 201 for the three-month value, keeping the remainder of the inputs (including the other interest rates associated with market curve 201) identical, and calculating the CVA. Similarly, CVA calculation 223 depicts modifying the interest rate associated with market curve 201 for the one-year value. Calculations 225, 227, and 229 represent further modifications.

Fully calculating every possibility of input (e.g., interest rate, time frame, swap) enables determination of the sensitivities of the CVA related to all possible inputs. But as discussed above, real-world CVA calculations may have thousands or millions of different inputs, making such a process prohibitive in terms of computer resources.

Another manner of calculating sensitivities is known as Tangent Algorithmic Differentiation (TAD). TAD involve determining partial derivatives of each steps in an equation in order to determine the sensitivities between inputs and outputs. For a simple set of calculations such as $y=f(x)=3x^2$ $z=g(y)=\sqrt{y+14}$ $m=h(z)=9z/\pi$ it is straightforward to calculate the sensitivities between x and m by using the chain rule and calculating the partial derivatives of each variable with respect to the next one, given that in this situation $m=h(g(f(x)))$. The sensitivity of m to x (that is, the partial derivative, $\frac{\partial m}{\partial x}$)

may be determined by calculating the partial derivatives of each variable with respect to the variables upon which it depends:

$$\frac{\partial m}{\partial x} = \frac{\partial m}{\partial z} * \frac{\partial z}{\partial y} * \frac{\partial y}{\partial x}$$

Processing numerous iterations of this equation as in the disclosed embodiments requires calculating each partial derivative in turn. As an example, if this equation (i.e., $m=h(g(f(x)))$) were part of a program (such as model code 101), tracing engine 105 may traverse the program and calculate the derivatives in turn, as follows:

1) tracing engine 105 reaches code representing $m=h(z)$ and calculates $$\frac{\partial m}{\partial z};$$

2) tracing engine 105 reaches code representing $z=g(y)$ and calculates $$\frac{\partial z}{\partial y};$$

3) tracing engine 105 computes $$\frac{\partial m}{\partial z} * \frac{\partial z}{\partial y}$$

to obtain $$\frac{\partial m}{\partial y};$$

4) tracing engine 105 reaches code representing $y=f(x)$ and calculates $$\frac{\partial y}{\partial x};$$

and 5) tracing engine 105 computes $$\frac{\partial m}{\partial y} * \frac{\partial y}{\partial x}$$

to obtain $$\frac{\partial m}{\partial x}$$

The above example may be more difficult to calculate when each input may have multiple values. Returning to FIG. 2A, the sensitivity of CVA 209 with respect to market curve 201 is one such complicated calculation—in example 200 there are five different interest rates for each of market curve 201 and the simulated curve 203 and five different cash flows in swap 205. Calculating the sensitivity of CVA 209 to MC 201 requires determining the sensitivity using all of these inputs. For example, calculating the sensitivity of CVA 209 would require performing three multiplication operations to account for the sensitivity to all inputs, starting with the first combination of 3-month market curve interest rate, 3-month simulated curve interest rate, and a first cash flow value:

$$\frac{\partial(SC-3\text{month})}{\partial(MC-3\text{month})} * \frac{\partial(Swap-Cash1)}{\partial(SC-3\text{month})} = \frac{\partial(Swap-Cash1)}{\partial(MC-3\text{month})}$$

$$\frac{\partial(Swap-Cash1)}{\partial(MC-3\text{month})} * \frac{\partial(Value)}{\partial(Swap-Cash1)} = \frac{\partial(Value)}{\partial(MC-3\text{month})}$$

$$\frac{\partial(Value)}{\partial(MC-3\text{month})} * \frac{\partial(CVA)}{\partial(Value)} = \frac{\partial(CVA)}{\partial(MC-3\text{month})}$$

The next calculation requires using the one-year market curve interest rate, 3-month simulated curve interest rate, and a first cash flow value:

$$\frac{\partial(SC-3\text{month})}{\partial(MC-1\text{year})} * \frac{\partial(Swap-Cash1)}{\partial(SC-3\text{month})} = \frac{\partial(Swap-Cash1)}{\partial(MC-1\text{year})}$$

$$\frac{\partial(Swap-Cash1)}{\partial(MC-1\text{year})} * \frac{\partial(Value)}{\partial(Swap-Cash1)} = \frac{\partial(Value)}{\partial(MC-1\text{year})}$$

$$\frac{\partial(Value)}{\partial(MC-1\text{year})} * \frac{\partial(CVA)}{\partial(Value)} = \frac{\partial(CVA)}{\partial(MC-1\text{year})}$$

This process of calculating the sensitivity of CVA 209 continues until tracing engine 105 reaches the end of all possible market curve interest rates, all possible simulated curve interest rates, and all possible cash flows. While each one of these calculations is straightforward, the fact that inputs can be dependent upon other inputs require duplicated calculations. For example, tracing engine 105 must repeat calculating $$\frac{\partial(Value)}{\partial(Swap-Cash1)} \text{ and } \frac{\partial(CVA)}{\partial(Value)}$$

for each of the respective sensitivities to inputs to market curve 201 and simulated curve 203. For full CVA calculations or other equations with thousands or millions of inputs, the number of wasted and duplicated calculations can make the overall calculations prohibitively large in terms of processing power, time, and memory.

FIG. 2B depicts exemplary Adjoint Automatic Differentiation (AAD) sensitivity calculations, consistent with embodiments of the present disclosure. In contrast to the calculations performed in FIG. 2A, CVA calculation 240 represents a "backwards" trace through the dependencies to determine the sensitivities of each input to calculation 240. This manner of calculation is known as Adjoint Algorithmic Differentiation (AAD). Using AAD to calculate sensitivities for CVA calculation 240 may comprise tracing starting at the end of the equation (i.e., CVA 241) and calculating partial derivatives of each input by tracing the equation in reverse. This saves resources on tracing some calculations, because the calculations that are duplicated in TAD mode (as depicted in FIG. 2A) may not need to be constantly recalculated. For example, the same derivatives that must be calculated multiple times in FIG. 2A $$\left( \frac{\partial(Value)}{\partial(Swap-Cash1)} \text{ and } \frac{\partial(CVA)}{\partial(Value)} \right)$$

can be calculated a single time when tracing through the equation before reaching Swap 245, SC 247, and MC 249 (at which point those partial derivatives are exhaustively calculated).

As discussed below with respect to FIGS. 3A, 3B, and 4, the particular manner of calculating sensitivities for complex equations may vary based on the particular programming of the computer program (e.g., model code 101) that incorporates the calculation of the equations. For example, AAD mode may be less efficient than TAD in situations with fewer inputs than outputs for a calculation.

Figure 3A:
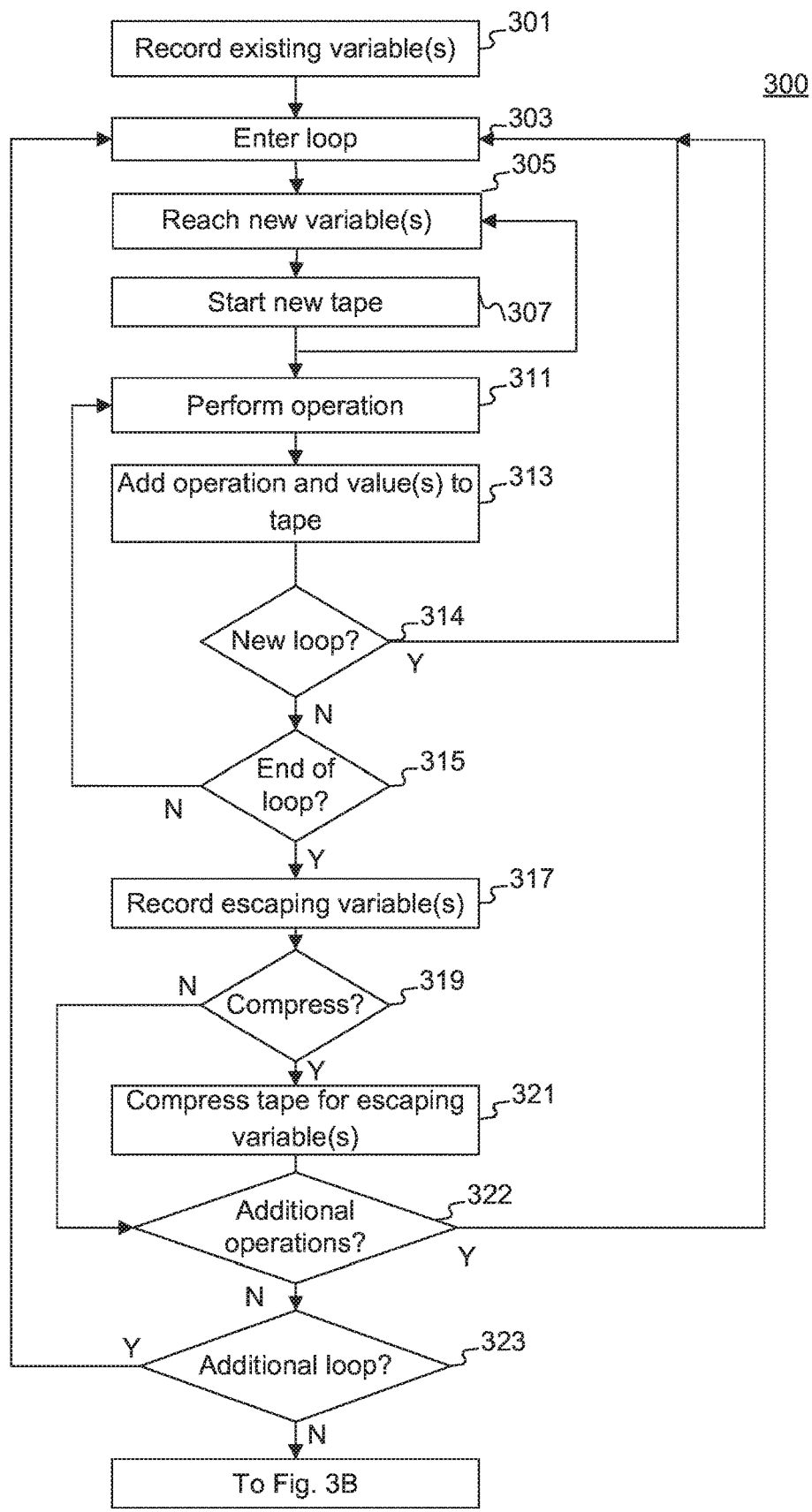
FIG. 3A depicts an exemplary process for inner loop compression and variable escape detection, consistent with disclosed embodiments.

FIG. 3A depicts an exemplary process 300 for inner loop compression and variable escape detection, consistent with disclosed embodiments. As explained above, tracing engine 105 may traverse model code 101 in order to calculate sensitivities of each variable used in model code 101. Process 300 may track each object (e.g., a variable) using "tape" that records the operations performed on and values assigned to each object. Tape may refer to, for example, a data structure that stores a set of operations (e.g., primitive functions such as "store in memory," "add," "subtract"), the operands to each operation (e.g., the variables passed in to the operation, such as integers or floating-point values), and intermediate calculation values (e.g., the product of two variables subtracted from a third variable, where the result of the product is stored as an intermediate calculation).

For example, the tape for a simple function $$f(x_1, x_2) = \left( \frac{1}{2}x_1 - x_2^2 \right)^3$$

may be stored as a data structure, e.g.:

| | | | |
|---|---|---|---|
| $z_1$ | divide | $x_1$ | 2 |
| $z_2$ | square | $x_2$ | |
| $z_3$ | subtract | $z_1$ | $z_2$ |
| $z_4$ | power | $z_3$ | 3 |

In some embodiments, the tape may be implemented as a data structure such as a Wengert list.

Process 300 enables faster computation of said sensitivities by "compressing" a tape when an object escapes an inner loop. An "inner loop" may be a loop structure that operates as part of a program. Compressing the tape may comprise, for example, collecting all operations and operands related to variable that escape a loop, and replacing those operations and operands from the tape with a single operation for each output. Once the tape is compressed, the memory used by the tape operations is reclaimed (e.g., freed), and multiple operations are replaced with single operations, successive runs of the program may be sped up.

Process 301 begins with tracing engine 105 running a program, such as the program represented by model code 101. Tracing engine 105 may record the current set of variables that are in memory during the operation of model code 101. For example, during execution of model code 101, tracing engine 105 may continuously keep track of which variables have been assigned, which variables have values that have changed, or which variables have been instantiated (e.g., variables for which memory has been allocated).

In step 303, tracing engine 105 reaches a first loop. Examples of such a loop include the following (written in Java):

- "for" or "count-controlled" loops, where a counter is incremented on every operation of the loop, and the loop operates until the counter reaches a specified value. An example is for (var=0; var<=10; var++) {foo (var);};
- "while" loops, a type of condition-controlled loop where a condition is used to test, at the beginning of each operation of the loop, whether the loop should operate again. An example is while (var<=10) {foo (var);}; and
- "do while" loops, a type of condition-controlled loop where a condition is used to test, at the end of each operation of the loop, whether the loop should operate again. An example is do {foo (var);} while (var<=10);
- "foreach" loops, a type of collection-controlled loop that enable a program to perform operations on all elements in an array, collection, or other structure. An example is for each (string var in stringArray) {foo (var);};

Other variations and other types of loops are possible as well.

After reaching a loop in step 303, process 300 continues to step 305 during which time tracing engine 105 processes the code in the loop. In step 305, tracing engine 105 reaches at least one new variable instantiated or assigned for the first time in the loop. Steps 303-315 represent operations performed by tracing engine 105 while in a loop (and which may be referred to as "inner loop" operations).

In step 307, tracing engine 105 instantiates a new tape for the loop entered in step 303. As explained above, the tape may store operations (e.g., primitive operations such as arithmetic) and operands (e.g., values of variables) to enable AAD and TAD computation. In step 311, tracing engine 105 may reach and perform a first operation in the loop of model code 101 entered in step 303. In step 313, tracing engine 105 may add the values utilized and operands used in the operation processed in step 311. As discussed above, the values and operands may be stored in a data structure such as a Wengert list.

In step 314, tracing engine determines whether a new loop has been reached in model code 101. For example, some code has loops inside of other loops ("nested loops"). If tracing engine 105 determines that it has reached a new loop while evaluating another loop, process 300 may continue to step 303 to process that loop. If not, process 300 may continue to step 315.

In step 315, tracing engine 105 determines whether the end of the loop has been reached after performing the operation in step 311. For example, tracing engine 105 may determine whether a condition that controls the loop (e.g., a counter incremented on every operation of the loop) has reached a particular value. If not, tracing engine 105 may return to step 311 to perform the next operation in the loop entered in step 303.

However, if tracing engine 105 determines that the end of the loop has been reached, in step 317, tracing engine 105 records which variables have escaped from the loop. This may be performed, for example, by comparing the variables in memory at step 317 with the variables recorded at step 301 before the loop was entered in step 303.

In step 319, tracing engine 105 determines whether or not to compress the tape started in step 307. Compressing the tape may comprise, for example, replacing the operations and operands in the loop with a single operation for each variable escaping from the loop. As discussed above, this reduces the memory footprint for reevaluating the operations in model code 101 by reducing the loop to a single operation where possible. Tracing engine 105 may determine whether or not to compress the loop based on a set of heuristics, such as the number of inputs and outputs to the loop. (An exemplary process is described below with respect to FIG. 4.)

If tracing engine 105 determines that the tape should be compressed in step 319, tracing engine 105 continues to step 321 and compresses the tape by replacing operations and operands with a single operation for each output as a function of the inputs to the loop. After compressing in step 321, process 300 continues to step 322. If tracing engine 105 determines that the tape should not be compressed, process 300 may continue to step 322 as well.

In step 322, tracing engine 105 determines whether any operations remain in the current loop. For example, as discussed above with respect to step 314, tracing engine 105 may consider model code 101 having "nested loops." Even if tracing engine determines that it has reached the end of a loop in step 315, tracing engine 105 may still be inside of a loop and that there may be operations left to process. If tracing engine determines that there are further operations in the loop, process 300 may continue to step 303 to process those operations. If not, process 300 may continue to step 323.

In step 323, tracing engine 105 determines whether there are further loops to process in model code 101. If so, process 300 may return to step 303 where tracing engine 105 may enter that new loop. If not, process 300 may end, and tracing engine may begin executing the steps in FIG. 3B.

Figure 3B:
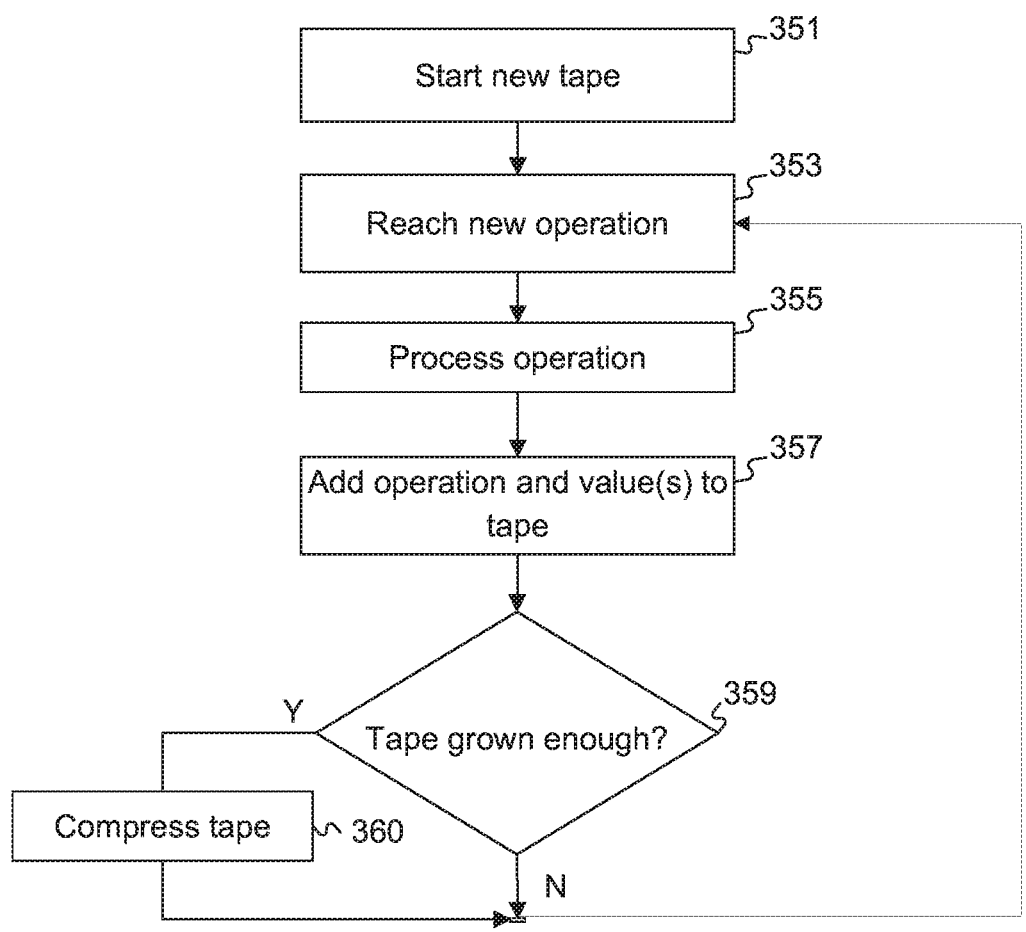
FIG. 3B depicts an exemplary process for outer loop compression, consistent with disclosed embodiments.

FIG. 3B depicts an exemplary process 350 for outer loop compression, consistent with disclosed embodiments. As discussed above, process 300 in FIG. 3A depicts operations taken on "inner loops" of a program such as model code 101. For example, "inner loops" may refer to loops that occur during the operation of a program. In contrast, "outer loops" refer to a "main" loop or function in a program. For example, in C or C++, an "inner loop" may be a "for" or "do while" loop in a function of the program, while the "outer loop" may refer to the main function which runs until the program ceases to operate.

In step 351, tracing engine 105 instantiates a new tape for the outer loop. As explained above, the tape may store operations (e.g., primitive operations such as arithmetic) and operands (e.g., values of variables) to enable AAD and TAD computation. This step may be performed before or after leaving an inner loop (e.g., as depicted in FIG. 3A). After step 351, process 350 continues to step 353, where tracing engine 105 may reach a first operation in the outer loop of model code 101. In step 355, tracing engine 105 may process the operation reached in step 353.

In step 357, tracing engine 105 adds the values and operands used in the operation processed in step 355. As discussed above, the values and operands may be stored in a data structure such as a Wengert list or other type of structure.

In step 359, tracing engine 105 determines how much the tape has grown since the last compression. This step may comprise considering whether the tape has grown by a particular amount or factor since the last time that the previous compression has occurred. Compressing the tape may comprise, for example, replacing the operations and operands reached in the outer loop (e.g., in step 353) with a single operation. As opposed to the compression in FIG. 3A, where a set of variables may be compressed based upon the variables escaping from the loop, in some embodiments, the outer loop has no variables that "escape" because there is no higher-level loop to promote compressed tapes to. In that sense, the outer loop controls the memory growth of model code 101.

In some embodiments, tracing engine 105 may determine that the tape has grown enough for compression if, for example, the tape has grown by a configurable factor compared to the last time that the tape was compressed. In one embodiment, the configurable factor is six. This means that if after a first operation in the outer loop, the tape comprises 10 elements, then after a second operation, the tape comprises 95 elements, step 359 will determine that the tape has grown by a factor of 9.5, and will thus compress the tape in step 360.

After compressing the tape in step 360, or determining that the tape has not grown enough to be compressed in step 359, process 350 may continue back to step 353, where tracing engine may process model code 101 until it reaches a new operation. Process 350 may thus repeat until the program completes or otherwise ceases (e.g., reaches a breakpoint), compressing the tape each time that the tape has grown by the configurable factor.

Figure 4:
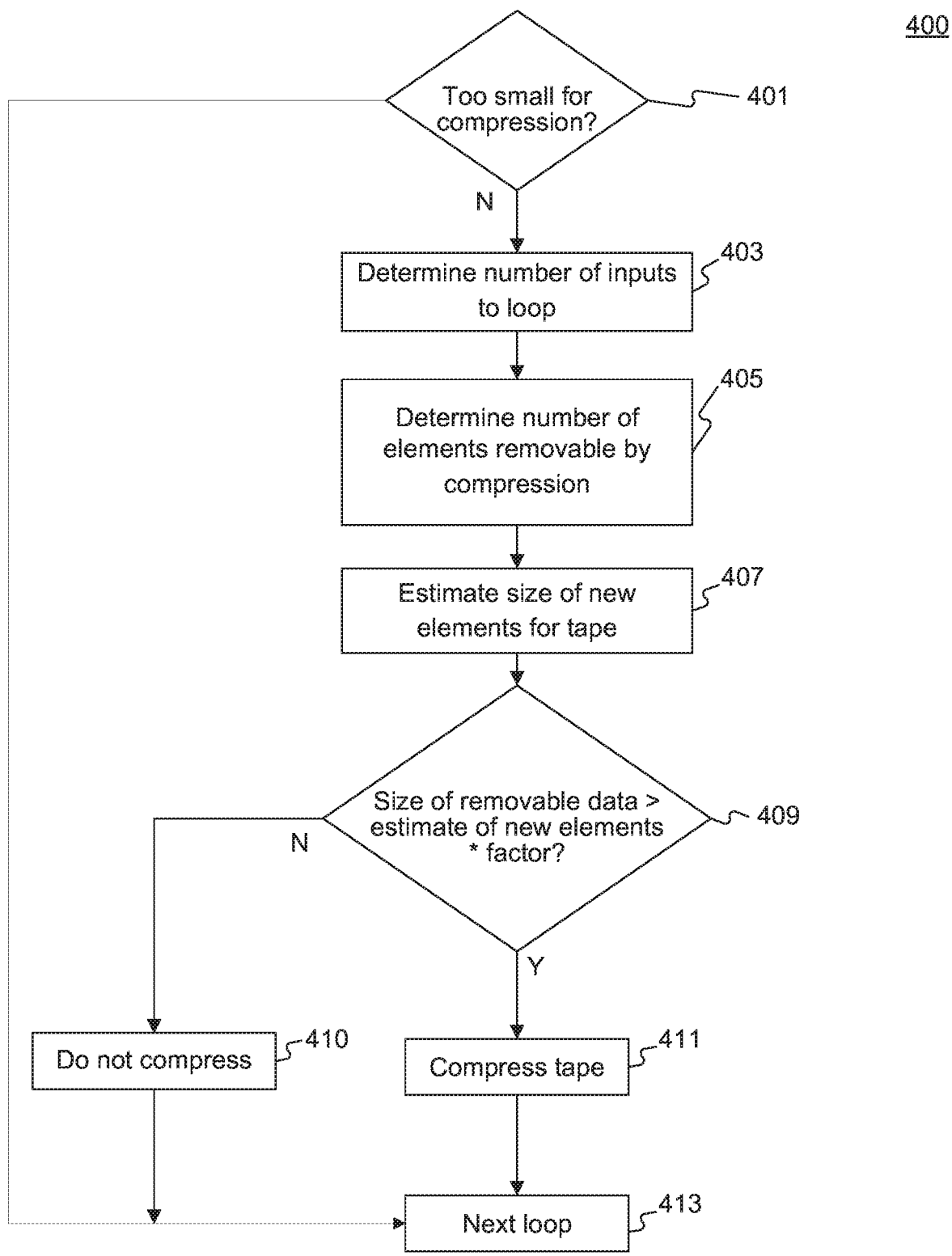
FIG. 4 depicts an exemplary process for determining whether to compress one or more tapes, consistent with disclosed embodiments.

FIG. 4 depicts an exemplary process 400 for determining whether to compress one or more tapes, consistent with disclosed embodiments. Process 400 represents steps that may be processed by tracing engine 105 when, for example, tracing engine 105 is determining whether or not to compress a tape. For example, process 400 may execute in place of step 319 ("Compress?") in process 300 depicted in FIG. 3A.

Process 400 begins at step 401 where tracing engine 105 determines whether a tape is smaller than a configurable amount. For example, if the tape has fewer than 30 elements, tracing engine 105 may determine that the tape is too small in that compressing the tape will not lead to any gains in performance or memory usage (and may in fact lead to wasted resources because of the process of compressing the tape). In that case, process 400 may continue to step 413 where the next loop in model code 101 is processed (e.g., step 323 in process 300 in FIG. 3A).

If tracing engine 105 determines that the tape is not too small for compression, process 300 continues to step 403, in which tracing engine 105 determines the number of variables input to a tape collected for the operations in an inner loop. (For example, this step may consider a tape started in step 307 and for which operations and values were added in step 313 of process 300 in FIG. 3A.) In step 405, tracing engine 105 determines the size of elements that are removable by a compression process. For example, as discussed above with respect to step 321 in FIG. 3A, compressing the tape may comprise replacing operations and operands with a single operation.

In step 407, tracing engine 105 estimates the size of the new elements that would have to be added to the tape to replace the elements removed from the tape due to the compression process. For example, this could be calculated by determining the size of the tape and subtracting from it the size of the removable elements. In other embodiments, the size of the tape may be estimated by assuming each output of the tape will use half of the inputs.

In step 409, tracing engine 105 determines whether the size of the elements removable by a compression process (determined in step 405) is greater than the estimate of the size of the new elements, multiplied by a configurable factor (e.g., 2). If the size of the removable elements is greater than two times the size of the new elements, then tracing engine 105 may perform the compression (step 411). Otherwise, tracing engine 105 may determine not to perform the compression (step 410). In either case, process 400 continues to step 413 where the next loop in model code 101 is processed (e.g., step 323 in process 300 in FIG. 3A).

Figure 5:
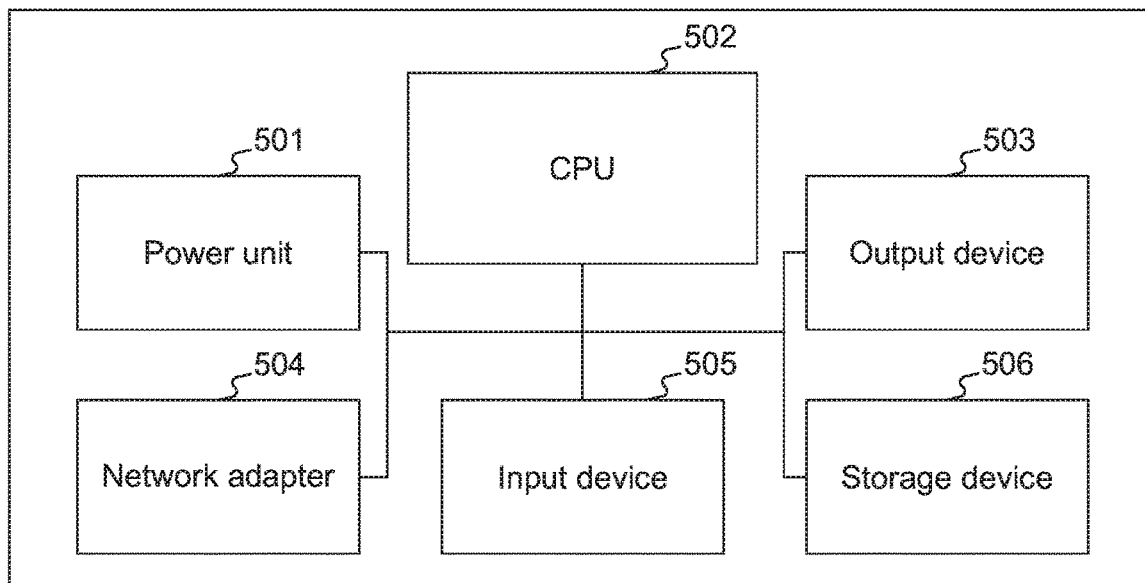
FIG. 5 depicts an exemplary computer system for implementing the disclosed methods, consistent with disclosed embodiments.

FIG. 5 illustrates example computer system 500 for implementing the disclosed embodiments. For example, platform 100—including model code 101, abstract vector layer 103, tracing engine 105, GPU platform 107, processor platform 109, and AAD platform 111—may be implemented as illustrated in computer system 500, in one or more of hardware, software, or firmware. In some embodiments, the components in FIG. 5 may be duplicated, substituted, or omitted. Each of the components in FIG. 4 can be connected to one another using, for example, a wired interconnection system such as a bus.

System 500 comprises power unit 501. Power unit 501 can be implemented as a battery, a power supply, or the like. Power unit 501 provides the electricity necessary to power the other components in system 500. For example, CPU 502 needs power to operate, and power unit 501 can provide the necessary electric current to power it.

System 500 comprises CPU (Central Processing Unit) 502, which enables data to flow between the other components and manages the operation of the other components in computer system 500. CPU 502, in some embodiments, can be implemented as a general-purpose processor (such as an Intel- or AMD-branded processor), a special-purpose processor (for example, a graphics processing unit (GPU) or a mobile processor), or any other kind of processor that enables input and output of data. System 500, in some embodiments, may more than one CPU 502, and each CPU may be of a different type. For example, one CPU 502i a (not pictured) may be a general-purpose processor while a second CPU may be a GPU 502b (not pictured). CPU 502a may divide up tasks between CPU 502a and GPU 502b based on complexity, type of calculation, or the like.

System 500 also comprises output device 503. Output device 503 can be implemented as a monitor, printer, speaker, plotter, or any other device that presents data processed, received, or sent by computer system 500.

System 500 also comprises network adapter 504. Network adapter 504, in some embodiments, enables communication with other devices that are implemented in the same or similar way as computer system 500. Network adapter 504, in some embodiments, may allow communication to and from networks such as the Internet or a Local Area Network (LAN). Network adapter 504 may be implemented using any or all of known or as-yet-unknown wired or wireless technologies (such as Ethernet, 802.11a/b/g/n (aka Wi-Fi), cellular (e.g. GSM, CDMA, LTE), or the like).

System 500 also comprises input device 505. In some embodiments, input device 505 may be any device that enables a user or other entity to input data. For example, input device 505 could be a keyboard, a mouse, or the like.

Input device 505 can be used to control the operation of the other components illustrated in FIG. 5.

System 500 also includes storage device 506. Storage device 506 stores data that is usable by the other components in system 500. Storage device 506 may, in some embodiments, be implemented as a hard drive, temporary memory, permanent memory, optical memory, or any other type of permanent or temporary storage device, including tangible, non-transitory computer-readable storage media. Storage device 506 may store one or more modules of computer program instructions and/or code that creates an execution environment for the computer program in question, such as, for example, processor firmware, a protocol stack, a database management system, an operating system, or a combination thereof.

The term "processor system," as used herein, refers to one or more processors (such as CPU 502). The disclosed systems may be implemented in part or in full on various computers, electronic devices, computer-readable media (such as CDs, DVDs, flash drives, hard drives, or other storage), or other electronic devices or storage devices. The methods and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). While disclosed processes include particular process flows, alternative flows or orders are also possible in alternative embodiments.

Certain features which, for clarity, are described in this specification in the context of separate embodiments may also be provided in combination in a single embodiment. Conversely, various features which, for brevity, are described in the context of a single embodiment may also be provided in multiple embodiments separately or in any suitable sub-combination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments have been described. Other embodiments are within the scope of the following claims.

What is claimed is:

1. A method for loop escape analysis, comprising the following instructions performed by at least one computer processor:
   receiving a set of executable computer instructions stored on a storage medium;
   analyzing the computer instructions to determine a loop;
   analyzing the computer instructions to determine at least one new variable in the loop;
   storing, in a data structure, at least one of an operation related to the variable or a value related to the variable;
   determining an escaping variable by comparing the variables stored in the data structure with variables included in the computer instructions;
   determining a number of inputs to the loop associated with the data structure, storage space that would be saved by compressing the data structure, and the size of new elements required to compress the data structure;
   upon reaching the end of the loop, determining whether to compress the data structure based on the determined escaping variable and comparing the size of the new elements and the saved storage space, and
   based on the determination, compressing the data structure by replacing the variable or the value in the loop with a single operation for each escape variable.

2. The method of claim 1, wherein compressing the data structure further comprises reducing the number of operations and values in the data structure.

3. The method of claim 1, further comprising instantiating a new data structure associated with each loop, and
   wherein storing at least one of an operation or a value in the data structure comprises storing operations and variables from a loop in a respective data structure.

4. The method of claim 1, further comprising:
   upon reaching the end of the loop, analyzing the computer instructions to determine an outer loop;
   analyzing the computer instructions to determine at least one new variable in the outer loop;
   storing, in a second data structure, at least one of an operation related to the variable or a value related to the variable;
   determining whether to compress the second data structure based on a comparison of the size of the second data structure to an earlier size of the second data structure.

5. The method of claim 1, wherein the set of executable computer instructions comprises instructions recompiled using a data structure in an abstract vector layer.

6. A system for loop escape analysis, comprising:
   a storage medium comprising a set of executable computer instructions; and
   a processor configured to execute operations comprising:
      analyzing the computer instructions to determine a loop;
      analyzing the computer instructions to determine at least one new variable in the loop;
      storing, in a data structure, at least one of an operation related to the variable or a value related to the variable;
      determining an escaping variable by comparing the variables stored in the data structure with variables included in the computer instructions;
      determining a number of inputs to the loop associated with the data structure, storage space that would be saved by compressing the data structure, and the size of new elements required to compress the data structure;
      upon reaching the end of the loop, determining whether to compress the data structure, based on the determined escaping variable and comparing the size of the new elements and the saved storage space, and
      based on the determination, compressing the data structure by replacing the variable or the value in the loop with a single operation for each escape variable.

7. The system of claim 6, wherein compressing the data structure further comprises reducing the number of operations and values in the data structure.

8. The system of claim 6, further comprising instantiating a new data structure associated with each loop, and
   wherein storing at least one of an operation or a value in the data structure comprises storing operations and variables from a loop in a respective data structure.

9. The system of claim 6, wherein the processor is further configured to execute operations comprising:
   upon reaching the end of the loop, analyzing the computer instructions to determine an outer loop;

analyzing the computer instructions to determine at least one new variable in the outer loop;

storing, in a second data structure, at least one of an operation related to the variable or a value related to the variable;

determining whether to compress the second data structure based on a comparison of the size of the second data structure to an earlier size of the second data structure.

10. The system of claim 6, wherein the set of executable computer instructions comprises instructions recompiled using a data structure in an abstract vector layer.

11. A tangible, non-transitory computer-readable medium comprising computer instructions for loop escape analysis, the instructions executable by at least one computer processor to perform a method comprising:

receiving a set of executable computer instructions stored on a storage medium;

analyzing the computer instructions to determine a loop;

analyzing the computer instructions to determine at least one new variable in the loop;

storing, in a data structure, at least one of an operation related to the variable or a value related to the variable;

determining an escaping variable by comparing the variables stored in the data structure with variables included in the computer instructions;

determining a number of inputs to the loop associated with the data structure, storage space that would be saved by compressing the data structure, and the size of new elements required to compress the data structure;

upon reaching the end of the loop, determining whether to compress the data structure based on the determined escaping variable and comparing the size of the new elements and the saved storage space, and based on the determination, compressing the data structure by replacing the variable or the value in the loop with a single operation for each escape variable.

12. The medium of claim 11, wherein compressing the data structure further comprises reducing the number of operations and values in the data structure.

13. The medium of claim 11, wherein the instructions further cause the at least one computer processor to instantiate a new data structure associated with each loop, and wherein storing at least one of an operation or a value in the data structure comprises storing operations and variables from a loop in a respective data structure.

14. The medium of claim 11, wherein the instructions further cause the at least one computer processor to perform a method comprising:

upon reaching the end of the loop, analyzing the computer instructions to determine an outer loop;

analyzing the computer instructions to determine at least one new variable in the outer loop;

storing, in a second data structure, at least one of an operation related to the variable or a value related to the variable;

determining whether to compress the second data structure based on a comparison of the size of the second data structure to an earlier size of the second data structure.

15. The medium of claim 11, wherein the set of executable computer instructions comprises instructions recompiled using a data structure in an abstract vector layer.

* * * * *